United States Patent
Kim et al.

(10) Patent No.: US 6,836,193 B1
(45) Date of Patent: Dec. 28, 2004

(54) DISCRETELY VARIABLE CAPACITOR FOR VOLTAGE CONTROLLED OSCILLATOR TUNING

(75) Inventors: Beomsup Kim, Cupertino, CA (US); Cormac S. Conroy, Sunnyvale, CA (US)

(73) Assignee: Berkana Wireless, Inc., Campbell, CA (US)

( * ) Notice: Subject to any disclaimer, the term of this patent is extended or adjusted under 35 U.S.C. 154(b) by 132 days.

(21) Appl. No.: 10/325,504

(22) Filed: Dec. 20, 2002

(51) Int. Cl.$^7$ .............................. H03B 5/08; H03L 7/099

(52) U.S. Cl. ....................... 331/179; 331/16; 331/36 C; 331/177 V

(58) Field of Search ................................ 331/10, 11, 16, 331/17, 18, 25, 36 C, 117 R, 117 FE, 117 D, 177 R, 177 V, 179

(56) References Cited

U.S. PATENT DOCUMENTS 5,519,265 A * 5/1996 Latham, II .................. 327/513

* cited by examiner

Primary Examiner—David Mis
(74) Attorney, Agent, or Firm—Van Pelt & Yi LLP

(57) ABSTRACT

A system and method are disclosed for generating a variable frequency output. A voltage controlled oscillator (VCO) is used. The VCO comprises a plurality of aggregate capacitor circuits, wherein each of the aggregate capacitor circuits has a collective capacitance, at least two of the collective capacitances have different values, and each of the aggregate capacitor circuits includes one or more individual capacitors wherein each of the individual capacitors are substantially the same size. The VCO further comprises a plurality of switches configured to select one or more aggregate capacitor circuits from among the plurality of aggregate capacitor circuits to form a discretely variable capacitor network having a discretely variable capacitance, wherein the discretely variable capacitor network is configured to cause an oscillator to generate a variable frequency as a result of the discretely variable capacitance.

12 Claims, 3 Drawing Sheets

DISCRETELY VARIABLE CAPACITOR FOR VOLTAGE CONTROLLED OSCILLATOR TUNING

FIELD OF THE INVENTION

The present invention relates generally to voltage controlled oscillators (VCO's). More specifically, a VCO that includes a discretely variable capacitance circuit in its oscillator is disclosed.

BACKGROUND OF THE INVENTION

Frequency synthesizers are widely used in modern communication systems, particularly wireless communication systems, to generate desired frequencies for modulation and demodulation. Many of the wireless protocols, for instance GSM or CDMA, support multiple frequency channels. Thus, the wireless devices used in systems supporting these protocols should be capable of transmitting and receiving signals at multiple frequencies, and the frequency synthesizers used in the wireless devices should be configurable to generate different frequencies.

Generally, a frequency synthesizer generates different frequencies by adjusting the oscillation frequency of its oscillator. Frequency synthesizers that require low phase noise and high quality of oscillation commonly employ LC tank oscillators with variable capacitors. Common variable capacitor designs often include a discretely variable capacitor for coarsely and quickly adjusting the capacitance to a desired range, and a continuously variable capacitor for fine tuning the capacitance.

Most of the existing implementations of the discretely variable capacitor fall into two categories: ones that switch among capacitors of the same size, and ones that use non-uniformly sized capacitors in a switching network. Uniformly sized capacitor designs have the disadvantage of requiring a large number of capacitors and hence a large number switches to provide a desired amount of variance in capacitance. The number of capacitors and switches can be reduced by using nonuniformly sized capacitors. Ideally, capacitor size would increase by a multiplier of 2, (1, 2, 4, 8, 16, etc.) to require a minimum number of capacitors and switches. However, such a different sized capacitor design tends to suffer from differential non-linearity (DNL) problems caused during the manufacturing process.

One approach that has been suggested to best deal with the issues described above is to use capacitors that increase in size, but not as aggressively as by powers of 2. Such a mixed radix or multiplier design is disclosed in U.S. Pat. No. 6,233,441 by Welland. This approach is a compromise that reduces the number of switches required by a one size capacitor design while reducing somewhat the introduced nonlinearities. However, nonlinearities are still introduced and switching is not minimized. It would be desirable if to develop a design that could further reduce the number of switches and avoid nonlinearities.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process., an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved frequency synthesizer design is disclosed. The design uses a discretely variable capacitor using switchable capacitor networks that have capacitors of the same size to adjust the oscillator frequency and produce different frequency outputs.

Figure 1:
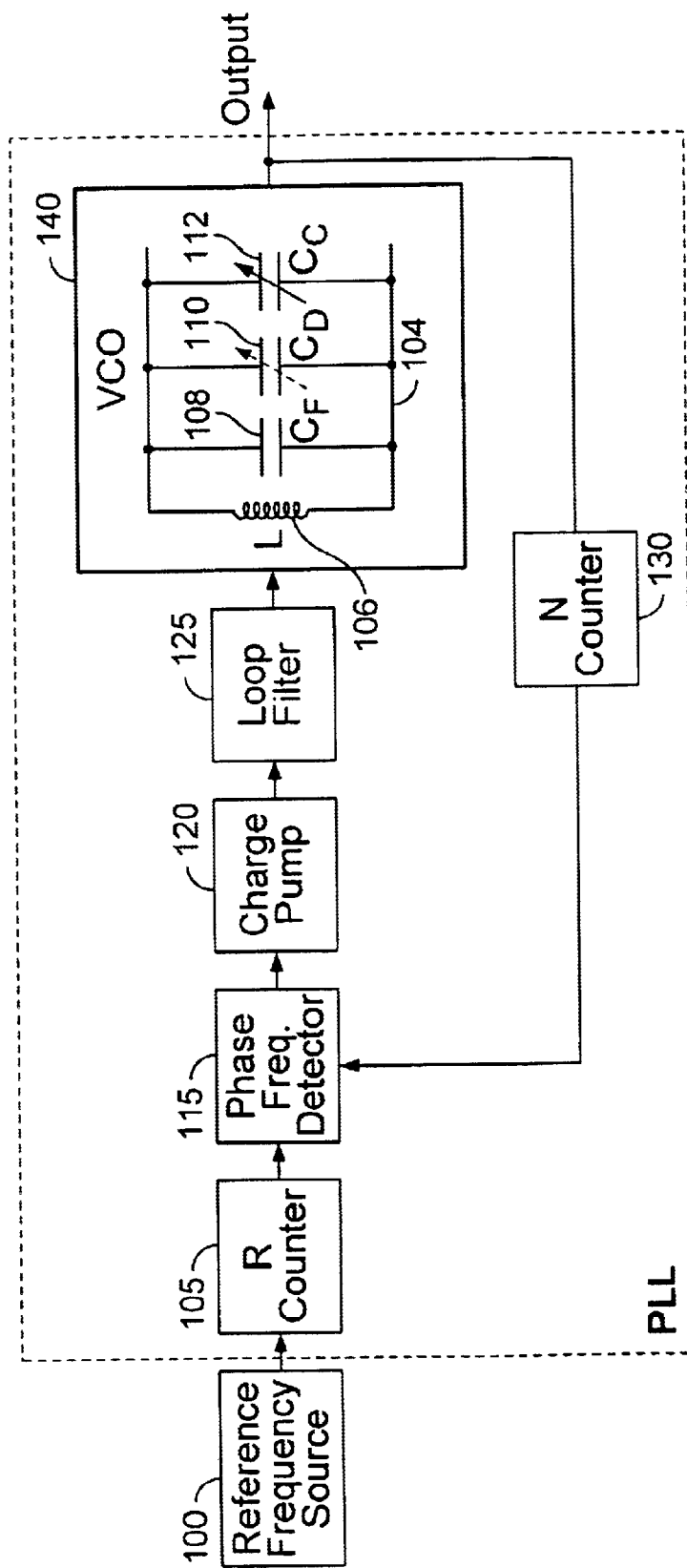
FIG. 1 is a block diagram illustrating a frequency synthesizer used in wireless communication systems, incorporating a VCO designed in accordance with the present invention.

FIG. 1 is a block diagram illustrating a frequency synthesizer used in wireless communication systems, incorporating a VCO designed in accordance with the present invention. A reference frequency input from reference frequency source 100 is sent to phase locked loop (PLL) 102. The PLL includes an R counter 105, a phase frequency detector 115, a charge pump 120, a loop filter 125, an N counter 130 and a voltage controlled oscillator (VCO) 140. Although an integer N PLL is shown for the purpose of illustration, fractional N PLLs and other types of PLLs are used in other embodiments. The disclosed tuning capacitor network is also used in other frequency synthesizers including direct modulation designs. The disclosed network is generally useful in any VCO or frequency synthesizer design that includes a tunable oscillator. The PLL is essentially a feedback control system that controls the input of VCO 140. When the PLL enters its locked state, a stable voltage is applied to the VCO so that the VCO oscillates at a desired frequency. Due to the phase noise requirements of the frequency synthesizer, an oscillator with high quality factor (Q), typically an LC tank oscillator, is used in the VCO. For the purposes of this example, the details of VCO 140 are not shown except for LC tank oscillator 104.

The LC tank oscillator has a resonate frequency $f_r$ that equals $$\frac{1}{2\pi\sqrt{LC}},$$

where L is the inductance and C is the capacitance. To make the resonate frequency adjustable, generally the oscillator is implemented with a fixed inductance and a variable capacitance. In FIG. 1, LC tank 140 includes: an inductor 106 with a fixed inductance; a fixed capacitor 108 with a fixed capacitance $C_F$; a discretely variable capacitor 110 having a capacitance $C_D$ that is adjustable to a discrete number of capacitance levels, used to quickly adjust the capacitance close to a desired value; and an optional continuously variable capacitor 112 having a capacitance $C_c$ that is used to fine tune the capacitance until it reaches a desired level.

Figure 2:
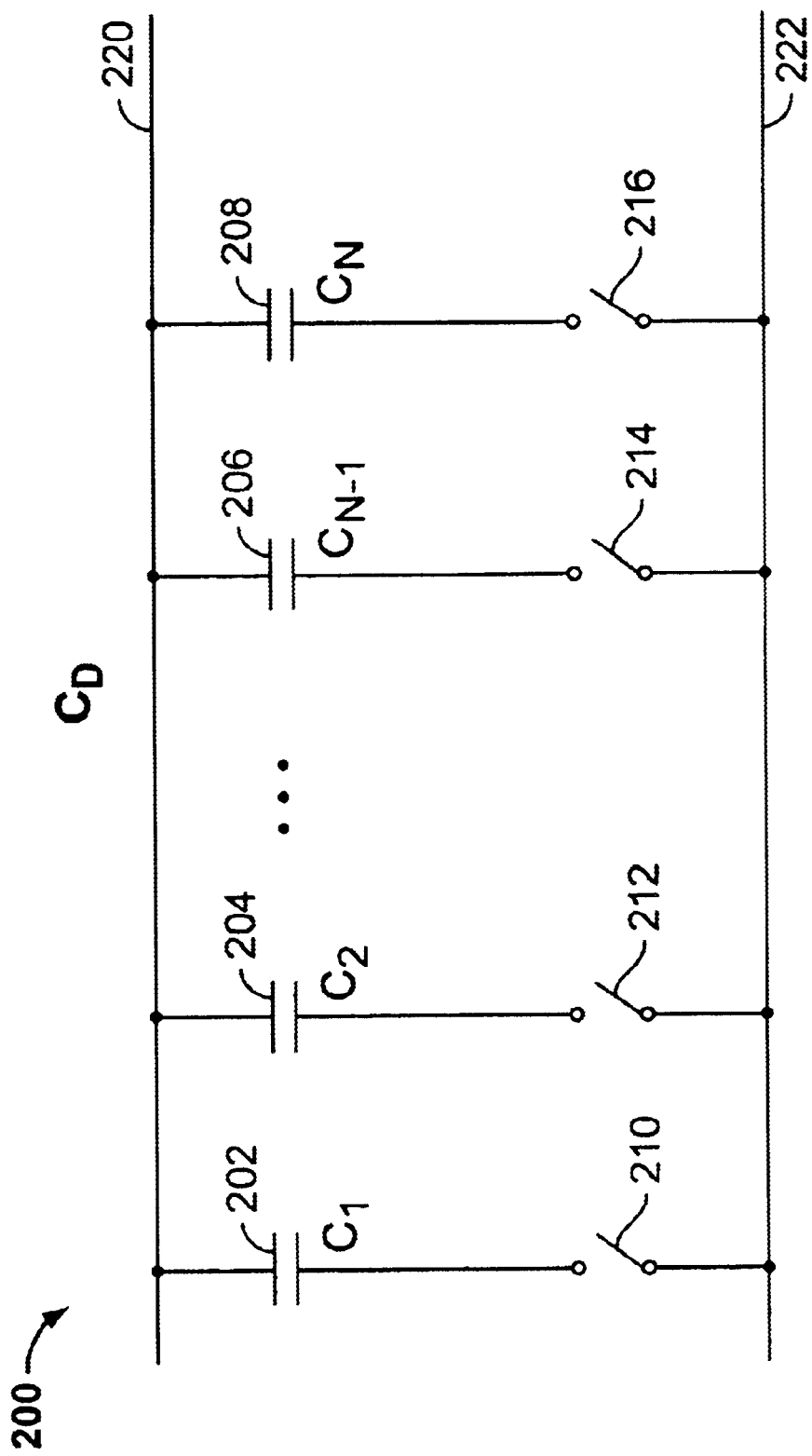
FIG. 2 is a circuit diagram illustrating a typical implementation of a discretely variable capacitor.

FIG. 2 is a circuit diagram illustrating a typical implementation of a discretely variable capacitor. Capacitor 200 comprises a capacitance network with a total of N capacitors connected in parallel, between terminal 220 and 222. Capacitor 202 has a capacitance of C1, and is coupled with a switch 210 that controls whether capacitor 202 is connected between the two terminals of the network. When the capacitor is connected to the network, its capacitance is added to the overall capacitance of the variable capacitor. Similarly, capacitors 204, 206, 208 and others are coupled with switches 212, 214, 216, etc., and the switches control whether a capacitor is connected to the capacitor network and whether its capacitance contributes to the overall capacitance of the circuit. In this configuration, the sum of the capacitance of the connected capacitors is the overall capacitance of the variable capacitor.

In some implementations, the capacitors in the capacitance network have the same capacitance value. A number of capacitors are switched on to produce the desired sum. In such implementations, the capacitance of each capacitor is set to a relatively small unit value. Thus, to obtain a desired capacitance that is relatively large, a large number of capacitors need to be switched on. As described above, different size capacitors may be used in the capacitance network so that connecting different switches connected to different sized capacitors may add a larger or smaller amount of capacitance to the network, decreasing the number of switches and capacitors required. This method, however, results in manufacturing problems involving differential nonlinearity.

Figure 3:
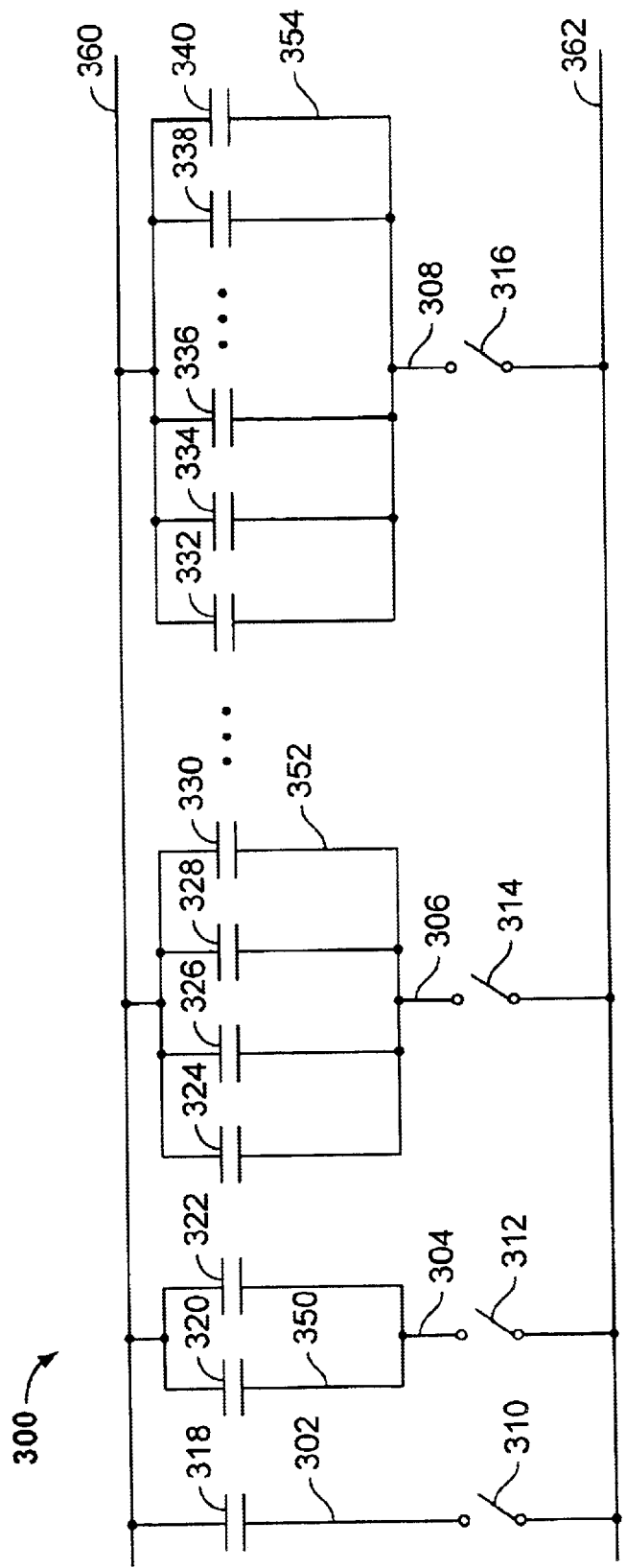
FIG. 3 is a circuit diagram illustrating a discretely variable capacitor embodiment according to the present invention.

FIG. 3 is a circuit diagram illustrating a discretely variable capacitor embodiment according to the present invention. Between two terminals 360 and 362 are a number of aggregate capacitor circuits 302, 304, 306, 308. Aggregate capacitor circuit, for example 304, has a capacitor network 350 that includes capacitors 320 and 322, and a switch 312 that is used to select the capacitor network. The switch can be implemented in a variety of ways, for instance using a transistor, as it is well known to those skilled in the art. Similarly, aggregate capacitor circuits 306 and 308 have corresponding capacitor networks 352 and 354, as well as switches 314 and 316. In other embodiments, the number of aggregate capacitor circuits and the number of capacitors in the capacitor networks vary. In some embodiments, the aggregate capacitor circuit associated with a switch has a different collective capacitance value than the other aggregate capacitor circuits associated with other switches. In one embodiment, the aggregate capacitance values increase using a multiplier of 2, (1, 2, 4, 8, 16, etc.) so that a minimum number of switches is required to select a desired overall capacitance value between terminals 360 and 362.

The individual capacitors used in each of the aggregate capacitor circuits, on the other hand, each are the same size or substantially the same size so that differential nonlinearities are not caused by the manufacturing process. For purposes of this specification, capacitors are considered substantially the same size if significant differential nonlinearities do not result when the capacitors are manufactured. Thus, whether capacitors are substantially the same size for the purpose of a given application depends on the manufacturing process and the impact of nonlinearities on the application.

In the embodiment shown, if n represents the number of capacitors in an aggregate capacitor circuit and C represents the capacitance of one capacitor, then the capacitance of the network is calculated to be n·C. When the switch associated with the capacitor network is closed, the capacitor network is connected to the rest of the circuit and its capacitance is added to the overall discrete capacitance between nodes 360 and 362.

The number of capacitors in each aggregate capacitor circuit varies in different embodiments. As described above, in one embodiment, the number of capacitors in each aggregate capacitor circuit increase by a multiplier of 2, thus minimizing the number of switches required. Other ratios are used in other embodiments, and in some embodiments, there is more than one ratio used. To tune the oscillator, the required combination of switches are selected and closed in the capacitor network.

For example, in an embodiment shown in FIG. 3, if the capacitance of aggregate capacitor circuits 302, 304, 306 and 308 are C, 2C, 4C and 8C, then, to obtain a capacitance of 10C, switches 312 and 316 are connected and aggregate capacitor circuits 304 and 308 are added to the overall capacitance.

A discretely variable capacitor network for use in a frequency synthesizer has been described. The capacitor network includes capacitors that are the same size or substantially the same size. The capacitor network includes aggregate capacitor circuits that include different numbers of capacitors. Each aggregate capacitor circuit is associated with a switch. The number of switches required to select a given capacitance is reduced by choosing the aggregate capacitor circuits to have different collective capacitances.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A voltage controlled oscillator (VCO) comprising:
   a plurality of aggregate capacitor circuits; wherein:
      each of the aggregate capacitor circuits has a collective capacitance;
      at least two of the collective capacitances have different values; and
      each of the aggregate capacitor circuits includes one or more individual capacitors wherein each of the individual capacitors are substantially the same size; and
   a plurality of switches configured to select one or more aggregate capacitor circuits from among the plurality of aggregate capacitor circuits to form a discretely variable capacitor network having a discretely variable capacitance; wherein the discretely variable capacitor network is configured to cause an LC tank oscillator to generate a variable frequency as a result of the discretely variable capacitance.

2. A VCO as recited in claim 1 wherein the discretely variable capacitor network is part of an LC tank oscillator.

3. A VCO as recited in claim 1 wherein the discretely variable capacitor network is part of an LC tank oscillator that further includes a continuously variable capacitor.

4. A VCO as recited in claim 1 wherein the aggregate capacitor circuits are connected in parallel.

5. A VCO as recited in claim 1 wherein the number of capacitors in the aggregate capacitor circuits is scaled by a multiplier.

6. A VCO as recited in claim 1 wherein the number of capacitors in the aggregate capacitor circuits is scaled by a multiplier of 2.

7. A VCO as recited in claim 1 wherein the oscillator is part of a voltage controlled oscillator controlled by a feedback loop formed by a phase locked loop.

8. A VCO as recited in claim 1 wherein:
   the one or more individual capacitors in each of the aggregate capacitor circuits are coupled between a first node and a second node;
   each of the plurality of switches is associated with one of the aggregate capacitor circuits, and is coupled between the second node and a third node; and
   the discretely variable capacitance is measured between the first node and the third node.

9. A VCO as recited in claim 1 wherein the VCO is included in a frequency synthesizer.

10. A VCO as recited in claim 1 further including a fixed capacitor having a fixed capacitance, wherein the fixed capacitor is connected to the plurality of aggregate capacitor circuits.

11. A VCO as recited in claim 1 further including a fixed capacitor having a fixed capacitance, and an inductor; wherein the fixed capacitor and the inductor are connected to the aggregate capacitor circuits.

12. A method for generating a variable frequency output using a VCO comprising:
   providing a plurality of aggregate capacitor circuits; wherein:
      each of the aggregate capacitor circuits has a collective capacitance;
      at least two of the collective capacitances have different values; and
      each of the aggregate capacitor circuits includes one or more individual capacitors wherein each of the individual capacitors are substantially the same size;
   selecting one or more aggregate capacitor circuits from among the plurality of aggregate capacitor circuits using a plurality of switches;
   configuring a discretely variable capacitor network having a discretely variable capacitance to cause an oscillator to generate a variable frequency as a result of the discretely variable capacitance.

* * * * *